United States Patent
Yin et al.

(10) Patent No.: US 9,608,064 B2
(45) Date of Patent: Mar. 28, 2017

(54) MOSFET STRUCTURE AND METHOD FOR MANUFACTURING SAME

(71) Applicant: Institute of Microelectronics, Chinese Academy of Sciences, Beijing (CN)

(72) Inventors: Haizhou Yin, Poughkeepsie, NY (US); Rui Li, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/905,307

(22) PCT Filed: Oct. 22, 2013

(86) PCT No.: PCT/CN2013/085625
§ 371 (c)(1),
(2) Date: Jan. 15, 2016

(87) PCT Pub. No.: WO2015/051561
PCT Pub. Date: Apr. 16, 2015

(65) Prior Publication Data
US 2016/0181363 A1    Jun. 23, 2016

(30) Foreign Application Priority Data
Oct. 13, 2013 (CN) .......................... 2013 1 0476519

(51) Int. Cl.
*H01L 29/08* (2006.01)
*H01L 29/06* (2006.01)
(Continued)

(52) U.S. Cl.
CPC ...... *H01L 29/0847* (2013.01); *H01L 21/0217* (2013.01); *H01L 21/02164* (2013.01);
(Continued)

(58) Field of Classification Search
None
See application file for complete search history.

(56) References Cited

U.S. PATENT DOCUMENTS 5,360,748 A * 11/1994 Nadahara ............ H01L 21/3221
148/DIG. 60
6,294,817 B1 * 9/2001 Srinivasan ........ H01L 29/66636
257/347
(Continued)

FOREIGN PATENT DOCUMENTS

| CN | 1595660 A | 3/2005 |
|---|---|---|
| CN | 1731569 A | 2/2006 |

(Continued)

OTHER PUBLICATIONS

International Search Report and Written Opinion mailed on Jul. 16, 2014 in International Application PCT/CN2013/085625.

*Primary Examiner* — Erik Kielin
(74) *Attorney, Agent, or Firm* — Pillsbury Winthrop Shaw Pittman LLP (57) ABSTRACT

Provided is a MOSFET, comprising: a substrate (100); a gate stack (500) on the substrate (100); source/drain regions (305) in the substrate on both sides of the gate stack (500); an interlayer dielectric layer (400) covering the source/drain regions; and source/drain extension regions (205) under edges on both sides of the gate stack (500); wherein insulators, which are not connected each other, are formed beneath the source/drain extension regions (205) under edges on both sides of the gate stack (500). By means of the MOSFET in the present disclosure, negative effects induced by DIBL on device performance can be effectively reduced.

8 Claims, 5 Drawing Sheets

(51) Int. Cl.
*H01L 29/66* (2006.01)
*H01L 29/78* (2006.01)
*H01L 21/02* (2006.01)

(52) U.S. Cl.
CPC ...... *H01L 29/0649* (2013.01); *H01L 29/6653* (2013.01); *H01L 29/66636* (2013.01); *H01L 29/78* (2013.01); *H01L 29/7833* (2013.01)

(56) References Cited

U.S. PATENT DOCUMENTS

| | | | |
|---|---|---|---|
| 2006/0244106 A1 | 11/2006 | Morikado | |
| 2007/0161169 A1* | 7/2007 | Belyansky | H01L 29/0653 438/197 |
| 2007/0218603 A1* | 9/2007 | Dyer | H01L 21/76243 438/153 |
| 2012/0217592 A1* | 8/2012 | Zhu | H01L 21/823807 257/412 |
| 2012/0286336 A1* | 11/2012 | Zhao | H01L 29/66636 257/288 |
| 2013/0210207 A1* | 8/2013 | Fukuda | H01L 21/76232 438/285 |

FOREIGN PATENT DOCUMENTS

| | | |
|---|---|---|
| CN | 1889273 A | 1/2007 |
| CN | 101145582 A | 3/2008 |
| CN | 101154615 A | 4/2008 |
| CN | 101170134 A | 4/2008 |
| JP | 62143471 A | 6/1987 |

* cited by examiner

MOSFET STRUCTURE AND METHOD FOR MANUFACTURING SAME

CROSS REFERENCE TO RELATED APPLICATION

This application is a national stage application, filed under 35 U.S.C. §371, of PCT Application No. PCT/CN2013/085625, filed on Oct. 22, 2013, entitled "MOSFET STRUCTURE AND METHOD FOR MANUFACTURING SAME", which claimed priority to Chinese Application No. 201310476519.2, filed on Oct. 13, 2013, all of which are hereby incorporated by reference in their entirety.

The present disclosure claims priority of Chinese patent application No. 201310476519.2 entitled "MOSFET and Method for Manufacturing the Same" filed on Oct. 13, 2013, the entirety of which is incorporated herein by reference.

TECHNICAL FIELD

The present disclosure relates to semiconductor manufacturing technique, and in particular, to a Metal Oxide Semiconductor Field Effect Transistor (MOSFET) with low leakage current and a method for manufacturing the same.

BACKGROUND

In MOSFET, it is desirable to have a channel as narrow as possible to enhance control of the channel by the gate and suppress short channel effects. However, as the channel length increases, device characteristic may be severely influenced by the short channel effects. Especially for the leakage current in off-state, as the gate length decreases, the ability of control to the channel by the gate is weakened. The device cannot be turned off completely because of the Drain Induction Barrier Lower (DIBL) effects and large leakage current is generated.

Drain Induction Barrier Lower (DIBL) is a non-ideal effect in short channel devices. When channel length decreases, source-drain voltage may increase such that P-N junction depletion regions of source and drain becomes closer and electric line in channel may punch through from source to drain, which may cause decrease of potential barrier in source end and increase of carriers from source to channel and thereby lead to increase of current in drain end. With further decrease of channel length, threshold voltage of transistors may decrease due to increasingly severe DIBL effects, which may result in decrease of device voltage gain and restrict improvement of integration level of Very Large Scale Integrated Circuits (VLSIC).

In the present disclosure, a method for controlling leakage current in off-state in MOSFET is provided. Specifically, insulators are formed on both sides of the gate in the semiconductor substrate. The insulators are located under the gate by 60-70 nm, and have a width of about 15-25 nm. The insulators are located very close to but not connected with the source and drain regions. By formation of insulators between the source and drain regions, the dielectric constant between the source and drain regions can be effectively increased and the capacitance coupling can be decreased. Further, by formation of the insulators between the source and the drain regions, the leakage current in the range of the thickness of the insulator can be reduced, and the leakage current above the range of the thickness of the insulator can be under control of the gate and turned off effectively. The current under the thickness of the insulator is located far away from the channel, and has a small influence on device performance. By means of the present invention, negative effects of DIBL on the device can be effectively reduced, leakage current in the device can be suppressed, and device performance can be enhanced.

SUMMARY OF INVENTION

A method for manufacturing a MOSFET is disclosed. The method comprises:
a. providing a substrate and a dummy gate, wherein the dummy gate is made of silicon dioxide;
b. forming a rectangular spacer on both sides of the dummy gate, wherein the rectangular spacer is made of silicon nitride;
c. depositing a silicon dioxide layer on both sides of the rectangular spacer, wherein the silicon dioxide layer is flushed with the dummy gate;
d. removing the rectangular spacer to expose the substrate, and anisotropically etching the exposed substrate to form a first vacancy;
e. filling a insulator into the first vacancy;
f. thinning the insulator to form a second vacancy;
g. epitaxially growing a silicon layer to fill into the second vacancy with the silicon on both sides of the second vacancy as a seed layer; and
h. removing the silicon dioxide layer to expose the substrate and the silicon layer.

Wherein after the step h, the method further comprises: i. forming source/drain extension regions, spacer, source/drain regions, an interlayer dielectric layer and a gate stack on the semiconductor structure in a single step.

Wherein the rectangular spacer has a width of about 15-25 nm.

Wherein the rectangular spacer is formed by:
j. forming a silicon nitride layer on the substrate and the dummy gate, wherein the thickness of the silicon nitride layer on sidewalls of the dummy gate is equal to that of the rectangular spacer;
k. forming a sacrificial spacer on the silicon nitride layer; and
l. isotropically etching the silicon nitride layer under the sacrificial spacer and on the substrate located on outer sides of the sacrificial spacer, so as to form the rectangular spacer.

Wherein the rectangular spacer is removed by wet etching.

Wherein the vacancy has a depth of about 70-80 nm.

Wherein the insulator is thinned by a combination of anisotropic etching and isotropic etching.

Wherein the insulator is made of silicon dioxide and/or silicon nitride.

A MOSFET is also disclosed in the present disclosure. The MOSFET comprises:
a substrate;
a gate stack on the substrate;
source/drain regions in the substrate on both sides of the gate stack;
an interlayer dielectric layer covering the source/drain regions; and source/drain extension regions in the substrate under edges on both sides of the gate stack;
wherein insulators, which are not connected each other, are formed under the source/drain extension regions under edges on both sides of the gate stack.

A method for controlling leakage current in off-state in MOSFET is disclosed in the present disclosure. Specially, insulators are formed in the semiconductor substrate on both sides of the gate stack. The insulators are located under the gate by 60-70 nm, and have a width of about 15-25 nm. The insulators are located closely to the source/drain regions and are not connected each other. By formation of insulators between the source/drain regions, the dielectric constant between the source/drain regions are increased, and the capacitance coupling is reduced. Further, by formation of the insulators between the source and the drain regions, the leakage current in the range of the thickness of the insulator can be reduced, and the leakage current above the range of the thickness of the insulator can be under control of the gate and turned off effectively. The current under the thickness of the insulator is located far away from the channel, and has a small influence on device performance.

By means of the present invention, negative effects of DIBL on the device can be effectively reduced, leakage current in the device can be suppressed and device performance can be enhanced.

DETAILED DESCRIPTION OF EMBODIMENTS

In the following, in order to make objectives, technical solutions and advantages of the present disclosure more clearer, embodiments of the present disclosure will be described in detail in connection with the attached drawings.

Hereinafter, embodiments of the present disclosure are described. Examples of the embodiments are shown in the attached drawings. The same or similar reference numbers denote the same or similar elements or elements having the same or similar function throughout the drawings.

Embodiments described with reference to the drawings are illustrative only, and are intended to interpret the invention rather than limiting the invention.

The present disclosure provides a MOSFET structure, comprising:
a substrate 100;
a gate stack on the substrate 100;
source/drain regions 305 on both sides of the gate stack in the substrate;
an interlayer dielectric layer 400 covering the source/drain regions 305; source/drain extension regions 306 under edges on both sides of the gate stack 600;
wherein insulators 200 are formed below the source/drain extension regions 306 under edges on both sides of the gate stack 600, and are not connected each other.

The insulators 200 are located under the gate by 60-70 nm, and have a width of about 15-25 nm. The insulators 200 are located closely to the source/drain hregions, respectively, and are not connected each other. By forming the insulators between source/drain regions, the dielectric constant between the source/drain regions is increased, and capacitance coupling between the source/drain regions is reduced. Besides, because of formation of the insulators between the source/drain regions, leakage current in the range of the thickness of the insulators may be effectively reduced. The current above the insulator thickness is in the range of gate control, and can be turned off effectively. The current below the insulator thickness is located far away from the channel, and has a small effect on the device characteristic.

The gate stack may comprise a gate dielectric layer, a work function adjusting layer and a gate metal layer.

The gate dielectric layer may be made of preferably, silicon oxynitride, or silicon oxide, or high-K materials.

And the Equivalent Oxide Thickness (EOT) thereof may be 0.5-5 nm.

The gate metal layer may be a metal gate, or may be a composite gate of metal/polysilicon with silicide formed on the polysilicon.

The semiconductor channel is formed on the surface of the substrate 100, and may be made of monocrystalline silicon or monocrystalline germanium alloy, and may have a thickness of about 5-20 nm.

The semiconductor channel is extremely light-doped, or undoped.

In case of doped semiconductor channel, the doping type is opposite to that of the source/drain regions.

The source/drain regions 305 are located in the substrate 100 on both sides of the gate stack, respectively.

The source region is symmetric to the drain regions, and the source/drain regions have a doping type opposite to that of the substrate.

Hereafter, the method for manufacturing the MOSFET according to the present disclosure will be described in detail with references the attached drawings.

It should be noted that the drawings of respective examples are illustrative only, and are not drawn to scale.

Figure 1:
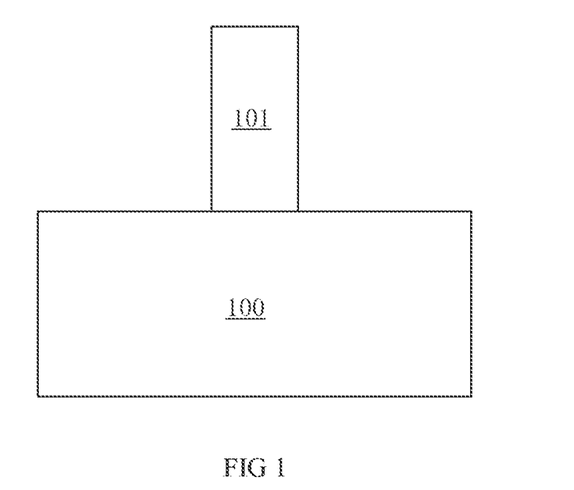
FIG. 1-14 are cross-sectional diagrams of a semiconductor structure in respective stage of a method according to the present disclosure.

Firstly, a substrate is provided. And a dummy gate structure 101 is formed on a gate dielectric layer, as shown in FIG. 1.

The dummy gate structure 101 may be a single layer structure, or may be a multi-layer structure.

The dummy gate structure 101 may be made of polymers, amorphous silicon, polysilicon or TiN, and may have a thickness of about 10-200 nm.

In the present embodiment, the dummy gate may comprise polysilicon and silicon oxide. Specifically, polysilicon may be filled into the gate vacancy by Chemical Vapor Deposition (CVD). Then, a silicon oxide dielectric layer may be formed on the polysilicon by, for example, epitaxial growth, oxidation or CVD.

Next, the deposited dummy gate may be processed by photolithography and etching in conventional CMOS processes to form a gate electrode pattern.

It should be noted that, if not stated otherwise, various dielectric materials in embodiments of the present disclosure may be deposited by the same or similar methods as that for forming the gate dielectric layer as described above, and may be omitted here.

Next, a silicon nitride layer is deposited on the semiconductor structure formed as described above, as shown in FIG. 2. The silicon nitride layer covers the semiconductor substrate 100 and the dummy gate structure 101, and has a thickness on sidewalls of the dummy gate structure which equals to the thickness of the rectangular spacer 102 to be formed.

Figure 2:
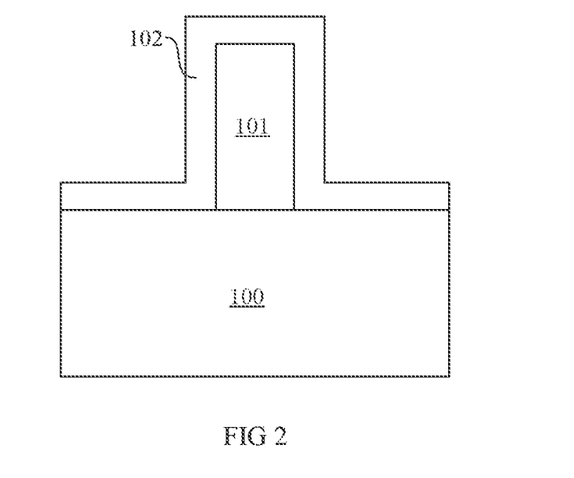

Specifically, the silicon nitride layer may be formed by CVD, Atomic Layer Deposition (ALD), Atmosphere Pressure CVD (APCVD), etc.

Figure 3:
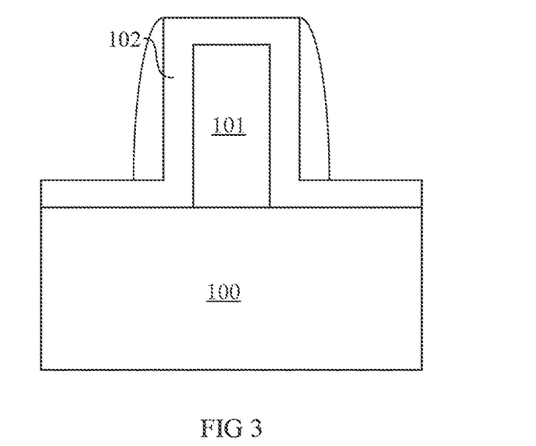

Next, a sacrificial spacer 103 is formed on the silicon nitride layer, as shown in FIG. 3. The sacrificial spacer 103 is made of silicon dioxide serving as a protecting mask in the following process for forming a directional spacer 102 by etching, and may have a maximal thickness equal to that of the silicon nitride formed in the aforementioned process. Specifically, a sacrificial spacer dielectric layer made of silicon dioxide is deposited by LPCVD. Then, a spacer 103 of silicon dioxide is formed on both sides of the gate stack by an etching back process. The spacer 103 may also be formed by depositing and etching.

Figure 4:
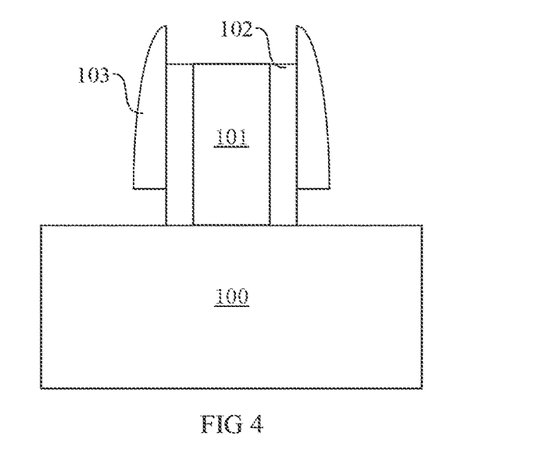
Figure 5:
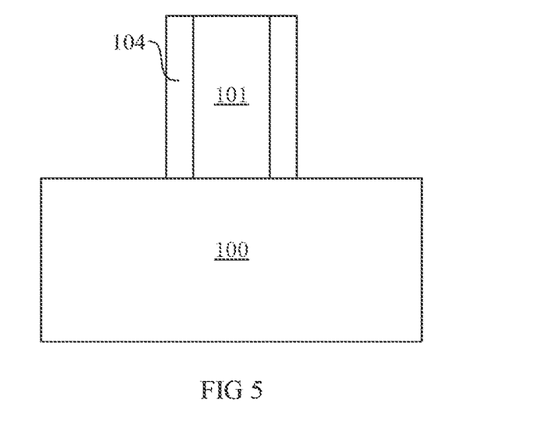

Next, the silicon nitride layer is isotropically etched to remove the silicon nitride below the sacrificial spacer 103 and on the substrate outside the sacrificial spacer 103, so as to form a rectangular spacer 102 which has a width of about 15-25 nm, as shown in FIG. 4. Specifically, the semiconductor structure may be selectively etched by means of hot phosphoric acid to expose a surface of the semiconductor substrate 100 and a top surface of the dummy gate structure 101. The nitride silicon layer is etched to form two rectangular spacers 102 on both sides of the dummy gate structure. Next, the sacrificial spacer 103 is removed to expose the rectangular spacers, as shown in FIG. 5.

Figure 6:
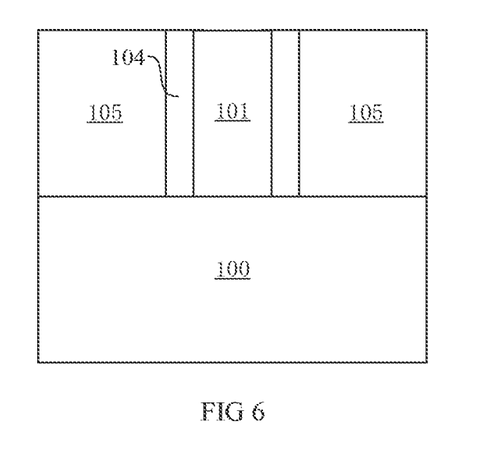
Figure 7:
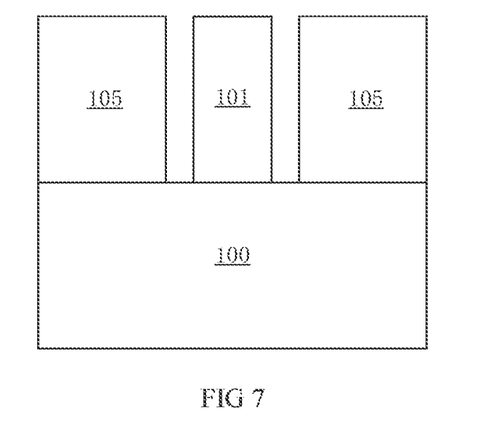

Next, as shown in FIG. 6, a silicon dioxide layer 105 is deposited on both sides of the rectangular spacer 102 to be flushed with the dummy gate 101 structure by, for example, epitaxial growth, CVD, etc., which is omitted here. Then, as shown in FIG. 7, the rectangular spacer 102 is removed to form rectangular spacer vacancies on the semiconductor structure.

Figure 8:
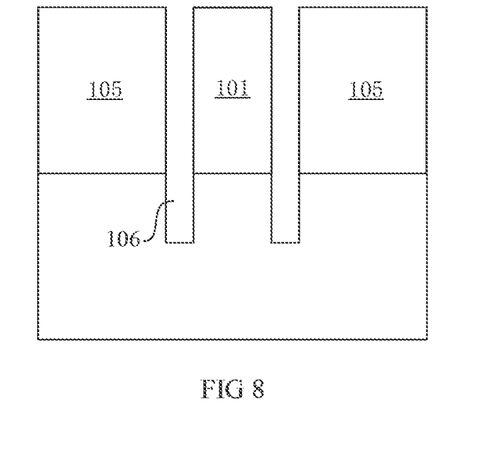
Figure 9:
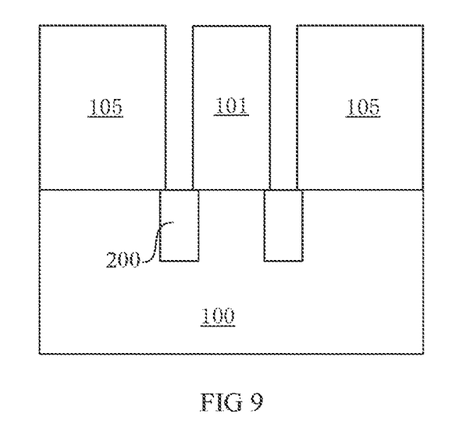

Next, the semiconductor structure is anisotropically etched with the dummy gate structure 101 and the silicon dioxide layer 105 as a mask, to form vacancies 106. The vacancies have a depth of about 70-80 nm and are located on both sides of the dummy gate structure, and may have a width equal to the thickness of the rectangular spacer 102, as shown in FIG. 8. Then, an insulator 200 may be filled into the vacancies 106. The insulator 200 may be silicon dioxide or silicon nitride. In the present embodiment, the insulator 200 may preferably be silicon dioxide, since the silicon dioxide has a larger dielectric constant than the silicon nitride. Specifically, silicon dioxide may be formed by oxidation with the silicon on sidewalls of the vacancies as an oxidation material. The oxidation may consume some silicon on sidewalls of the vacancies, as shown in FIG. 9.

Figure 10:
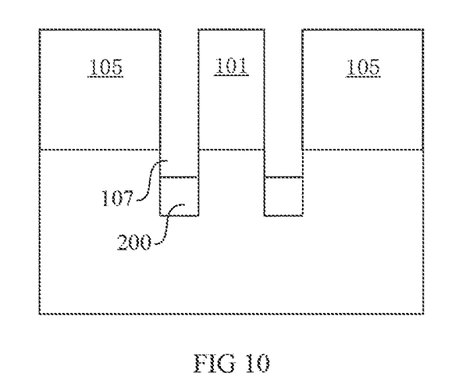
Figure 11:
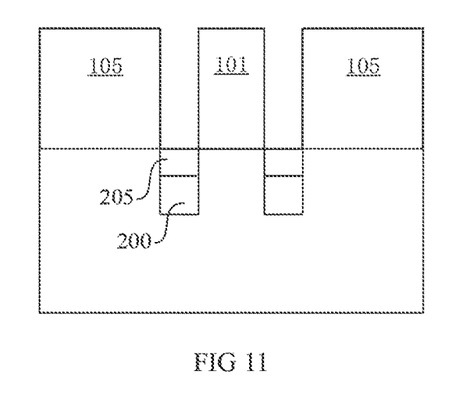

Next, the insulator may be thinned to form vacancies 107. Specifically, the thinning may be a combination of isotropic etching and anisotropic etching. First, the semiconductor structure is thinned by anisotropic etching such that the dummy gate structure 101, the silicon dioxide 105 and the insulator 200 are thinned by the same thickness. Next, isotropic etching is performed to remove the silicon dioxide layer into the substrate in oxidation, so as to expose the silicon in the substrate. The semiconductor structure after formation of vacancies is shown in FIG. 10. Then epitaxial growth is performed with the silicon on sidewalls of the vacancies 107 as a seed layer to form a silicon layer 205 so as to fill into the vacancies 107 such that the silicon grown in the vacancies is flushed with the surface of the semiconductor substrate. Since the silicon in the semiconductor substrate 100 is used as the seed layer in the epitaxial growth, the silicon layer 205 has the same lattice structure as that of the semiconductor substrate. The semiconductor structure after the filling is shown in FIG. 9.

Figure 12:
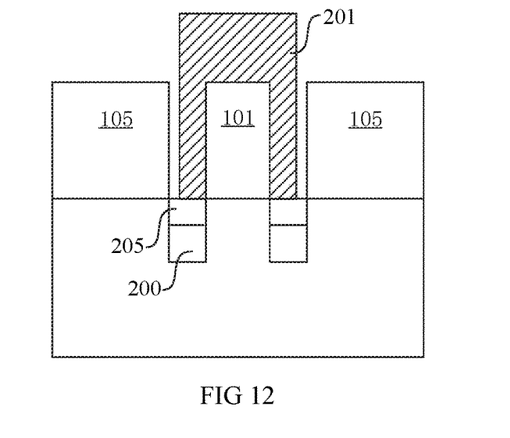
Figure 13:
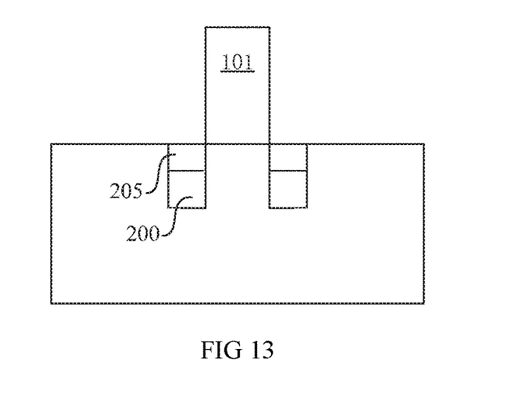
Figure 14:
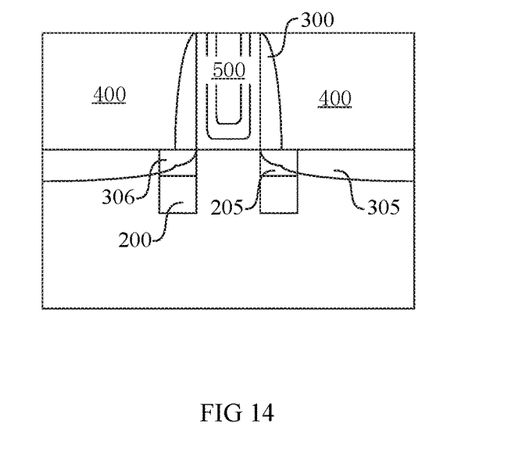

Next, the semiconductor structure is selectively etched with the photo resist layer covered on the dummy gate structure 101 as a mask, as shown in FIG. 12. The silicon dioxide layer 105 is removed to expose the surface of the substrate underneath, as shown in FIG. 13. The photoresist layer 201 is then removed to expose the dummy gate structure 101.

Next, the substrate on both sides of the dummy gate structure is lightly doped to form source/drain extension regions 306. Further, halo implantation may be performed to form a halo implantation region. The dopant type for the light doping is the same as the device type, and the dopant type for halo implantation is opposite to be device type.

Next, spacers 300 are formed on sidewalls of the gate stack to separate the gates. Specifically, a sacrificial spacer dielectric layer of silicon dioxide is deposited with a thickness of about 40-80 nm by LPCVD. Then, spacers 300 of silicon nitride are formed with a width of about 35-75 nm on both sides of the gate by a etching-back technique. The spacers 300 may also be formed by silicon oxide, silicon oxynitride, silicon carbide, or any combination thereof and/or other materials as appropriate. The spacers 300 may have a multi-layer structure. The spacers 300 may also be formed by a deposition and etching process, and may have a thickness of about 10-100 nm, for example, 30 nm, 50 nm or 80 nm.

Next, a dielectric layer of silicon dioxide with a thickness of about 10-35 nm may be deposited on the semiconductor structure to form an interlayer dielectric layer 400. Then, dopants may be implanted into the source/drain regions with the interlayer dielectric layer as a buffer layer. For a p-type crystal, the dopants may be B, $BF_3$, In or Ga. For a n-type crystal, the dopants may be P, As or Sb. The doping concentration may be about $5\times10^{19}$ $cm^{-3}$-$1\times10^{20}$ $cm^{-3}$.

Next, the dummy gate structure may be removed to form a dummy gate vacancy. The dummy gate structure may be removed by wet etching and/or dry etching. In one embodiment, the dummy gate structure may be removed by plasma etching.

Next, a gate dielectric layer, a work function adjusting layer and a metal gate layer may be sequentially formed in the gate vacancy. The metal gate layer may be a metal gate, or may be a composite gate of metal/polysilicon with silicide formed on the polysilicon. As shown in FIG. 4, preferably, a work function adjusting layer is formed on the gate dielectric layer, and then a metal gate layer may be formed on the work function adjusting layer. The work function adjusting layer may be formed of TiN, TaN, and may have a thickness of about 3-15 nm. The metal gate layer may be a single-layer structure or a multi-layer structure, may be formed by TaN, TaC, TiN, TaAlN, TiAlN, MoAlN, TaTbN, TaErN, TaYbN, TaSiN, HfSiN, MoSiN, $RuTa_x$, $NiTa_x$, or combinations thereof and may have a thickness of about 10-40 nm, for example, 20 nm or 30 nm.

A method for controlling leakage current in off-state of MOSFET is provided in the present disclosure. Specifically, insulators are formed in the substrate on both sides of the gate. The insulators are formed under the gate by 60-70 nm, have a width of about 15-25 nm, and are located closely, but not connected, to the source/drain regions, respectively. By forming insulators between the source/drain regions, the dielectric constant between the source/drain regions can be increased, and the capacitance coupling between the source/drain regions can be decreased. Further, by formation of the insulators between the source and the drain regions, the leakage current in the range of the thickness of the insulator can be reduced, and the leakage current above the range of the thickness of the insulator can be under control of the gate and turned off effectively. The current under the thickness of the insulator is located far away from the channel, and has a small influence on device performance. By means of the present invention, negative effects of DIBL on the device can be effectively reduced, leakage current in the device can be suppressed, and device performance can be enhanced.

Although the exemplary embodiments and their advantages have been described in detail, it should be understood that various alternations, substitutions and modifications may be made to the embodiments without departing from the spirit of the present invention and the scope as defined by the appended claims. For other examples, it may be easily recognized by a person of ordinary skill in the art that the order of processing steps may be changed without departing from the scope of the present invention.

In addition, the scope to which the present invention is applied is not limited to the process, mechanism, manufacture, material composition, means, methods and steps described in the specific embodiments in the specification. According to the disclosure of the present invention, a person of ordinary skill in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

The invention claimed is:

1. A method for manufacturing a MOSFET, comprising:
   a. providing a substrate (100) and a dummy gate (101), wherein the dummy gate (101) is made of silicon dioxide;
   b. forming a rectangular spacer (102) on both sides of the dummy gate (101), wherein the spacer is made of silicon nitride;
   c. depositing a silicon dioxide layer (105) on both sides of the rectangular spacer (102), wherein the silicon dioxide layer (105) is flush with the dummy gate (101);
   d. removing the rectangular spacer (102) and anisotropically etching the exposed substrate to form a first vacancy (106);
   e. filling an insulator (200) into the first vacancy (106);
   f. thinning the insulator to form a second vacancy (107);
   g. performing an epitaxial growth with the silicon on sidewalls of the second vacancy as a seed layer, so as to form a silicon layer (205) to fill into the second vacancy (107); and
   h. removing the silicon dioxide layer (205) to expose the substrate (100) and the silicon layer (205).

2. The method of claim 1, wherein after the step h, the method further comprises: i. sequentially forming source/drain extension regions, a spacer (300), source/drain regions (305), an interlayer dielectric layer (400) and a gate stack (500) on the semiconductor structure.

3. The method of claim 1, wherein the rectangular spacer (102) has a width of about 15-25 nm.

4. The method of claim 1, wherein the rectangular spacer is formed by:
   j. forming a silicon nitride layer on the substrate (100) and the dummy gate (101), wherein the thickness of the silicon nitride layer on sidewalls of the dummy gate (101) is equal to that of the rectangular spacer (102) to be formed;
   k. forming a sacrificial spacer (103) on the silicon nitride layer; and
   l. isotropically etching the silicon nitride layer under the sacrificial spacer (103) and on the substrate located on outer sides of the sacrificial spacer, so as to form the rectangular spacer (102).

5. The method of claim 1, wherein the rectangular spacer (102) is removed by wet etching.

6. The method of claim 1, wherein the first vacancy (106) has a depth of about 70-80 nm.

7. The method of claim 1, wherein the insulator (200) is thinned by a combination of anisotropic etching and isotropic etching.

8. The method of claim 1, wherein the insulator (200) is made of silicon dioxide and/or silicon nitride.

* * * * *